US007658800B2

(12) United States Patent
Chen et al.

(10) Patent No.: US 7,658,800 B2
(45) Date of Patent: Feb. 9, 2010

(54) GAS DISTRIBUTION ASSEMBLY FOR USE IN A SEMICONDUCTOR WORK PIECE PROCESSING REACTOR

(75) Inventors: AiHua Chen, Shanghai (CN); Shulin Wang, Campbell, CA (US); Henry Ho, San Jose, CA (US); Gerald Yin, Shanghai (CN); Qing Lv, Shanghai (CN); Li Fu, San Francisco, CA (US)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 152 days.

(21) Appl. No.: 11/602,568

(22) Filed: Nov. 20, 2006

(65) Prior Publication Data

US 2008/0092815 A1    Apr. 24, 2008

(30) Foreign Application Priority Data

Oct. 18, 2006    (CN) .................. 2006 1 0117260

(51) Int. Cl.
*C23C 16/00* (2006.01)
*C23F 1/00* (2006.01)
*H01L 21/306* (2006.01)

(52) U.S. Cl. ................... 118/715; 156/345.34
(58) Field of Classification Search ........... 118/715; 156/345.34

See application file for complete search history.

(56) References Cited

U.S. PATENT DOCUMENTS

| 5,595,606 | A | * | 1/1997 | Fujikawa et al. ............ 118/725 |
| 5,624,498 | A | | 4/1997 | Lee et al. |
| 5,963,834 | A | | 10/1999 | Hatano et al. |
| 6,086,677 | A | | 7/2000 | Umotoy et al. |
| 6,089,184 | A | | 7/2000 | Kaizuka et al. |
| 6,148,761 | A | | 11/2000 | Majewski et al. |
| 6,245,192 | B1 | | 6/2001 | Dhindsa et al. |
| 6,302,964 | B1 | | 10/2001 | Umotoy et al. |
| 6,415,736 | B1 | | 7/2002 | Hao et al. |
| 6,435,428 | B2 | | 8/2002 | Kim et al. |
| 2005/0092248 | A1 | * | 5/2005 | Lee et al. .................... 118/715 |
| 2005/0263248 | A1 | | 12/2005 | Rocha-Alvarez et al. |
| 2006/0021703 | A1 | | 2/2006 | Umotoy et al. |

\* cited by examiner

*Primary Examiner*—Michael Cleveland
*Assistant Examiner*—Keath T Chen
(74) *Attorney, Agent, or Firm*—Nixon Peabody LLP; Joseph Bach, Esq.

(57) ABSTRACT

A semiconductor work piece processing reactor is described and which includes a processing chamber defining a deposition region; a pedestal which supports and moves a semiconductor work piece to be processed within the deposition region of the processing chamber; and a gas distribution assembly mounted within the processing chamber and which defines first and second reactive gas passageways which are separated from each other, and which deliver two reactant gases to a semiconductor work piece which is positioned near the gas distribution assembly.

21 Claims, 10 Drawing Sheets

GAS DISTRIBUTION ASSEMBLY FOR USE IN A SEMICONDUCTOR WORK PIECE PROCESSING REACTOR

RELATED PATENT DATA

This application claims priority from Chinese Patent Application Serial No. 200610117260.2, and which was filed on Oct. 18, 2006.

TECHNICAL FIELD

The present invention relates to a gas distribution assembly for use in a semiconductor work piece processing reactor, and more specifically to a gas distribution assembly which, when installed within a semiconductor work piece processing reactor, is operable to deliver gaseous chemicals to a semiconductor work piece for purposes of depositing uniform films or layers on the surface of the semiconductor work piece by chemical vapor deposition, atomic layer deposition or the like.

BACKGROUND OF THE INVENTION

Chemical vapor deposition and atomic layer deposition are critical manufacturing steps in semiconductor fabrication. In particular, the deposition of oxide films is an important component in the fabrication of integrated circuits. More specifically, it has long been known that thermal processing must typically be employed if gaps are required to be filled in an integrated circuit construction. In this regard, the materials TEOS and Ozone are usually employed to fabricate undoped, thermal oxide films. Heretofore, chemical vapor deposition chambers of traditional designs have included a showerhead chemical distribution system. The prior art shows several varieties of these showerheads. For example, there is a premixing showerhead and a post mixing showerhead. In premixing showerheads all chemicals are premixed in the showerhead before entering the reaction zone where they are subsequently deposited on the semiconductor work piece.

The advantage of the prior art premixing showerheads is that the chemical reactants are substantially fully mixed so that the resulting chemical composition can be uniformly deposited across the surface of the semiconductor work piece. In these premixing showerheads, the temperature of the showerhead needs to be closely controlled in order to minimize potential chemical reactions. In the situation where chemicals such as TEOS and Ozone are employed for thermal oxide deposition, an increase in the showerhead temperature typically reduces the likelihood of liquid condensation if a liquid chemical is used, and will thereafter favor the delivery of TEOS. However, higher temperatures experienced within the showerhead typically reduces the Ozone concentration since the half-life time of this chemical is strongly temperature dependent.

Still further, it has long been recognized that when TEOS and ozone are premixed in a showerhead, polymerization and particle formation may result. This production of particles within the showerhead can potentially deteriorate the resulting gap fill performance of the resulting oxide film in an integrated circuit construction, if these polymeric particles are deposited on the semiconductor work piece surface.

To address the deficiencies noted in the prior art premixing showerheads, a number of post-mixing showerheads have been proposed. Still further, other designs of showerheads have been suggested in the prior art. For example, the prior art is replete with numerous post-mixing showerhead designs, and the Office's attention is directed to U.S. Pat. Nos. 5,624,498; 5,963,834; 6,148,761; 6,086,677; 6,089,184; 6,245,192; 6,302,964; 6,415,736; 6,435,428 and U.S. Publication Nos. US2005/0263248 and US2006/0021703. While these prior art devices and teachings have worked with varying degrees of success, those skilled in the art have long sought after a showerhead which reliably allows the delivery of a plurality of reactant chemicals such as TEOS and Ozone to a semiconductor work piece while substantially avoiding the shortcomings of the prior art which includes the formation of various particles which may be deposited on the semiconductor work piece or within the showerhead itself.

Therefore, a gas distribution assembly for use in a semiconductor work piece processing reactor is the subject matter of the present application.

SUMMARY OF THE INVENTION

A first aspect of the present invention relates to a gas distribution assembly which includes a reactant gas supply plate which is coupled in fluid flowing relation relative to at least first and second reactant gases; at least one reactant gas distribution plate coupled in fluid receiving relation relative to the reactant gas supply plate for substantially evenly distributing at least one of the first and second reactant gases; and a reactant gas delivery face plate coupled in fluid receiving relation relative to the reactant gas distribution plate, and wherein the first and second reactant gases remain separated as they pass through the reactant gas supply plate, gas distribution plate and gas delivery face plate and then further exit the reactant gas delivery face plate in a substantially evenly distributed fashion.

Still further, another aspect of the present invention relates to a gas distribution assembly which includes a reactant gas supply plate coupled in fluid flowing relation relative to at least a first and second reactant gas supply, and wherein the reactant gas supply plate has a top and a bottom surface, and wherein a first reactant gas passageway is formed substantially centrally thereof and extends between the top and bottom surfaces, and wherein the first reactant gas is coupled in fluid flowing relation relative to the first reactant gas passageway, and further exits the bottom surface thereof, and wherein a plurality of second reactant gas passageways are formed in the top surface and extend to the bottom surface thereof, and wherein the plurality of second reactant gas passageways are distributed in a first plurality of predetermined, spaced zones about the top surface thereof; a reactant gas distribution plate having a top surface which is juxtaposed relative to the bottom surface of the reactant gas supply plate, and an opposite bottom surface, and wherein the top surface of the reactant gas distribution plate has a plurality of spaced gas channeling blocks which are arranged in a second plurality of zones that are individually substantially aligned with the first plurality of zones formed in the reactant gas supply plate, and wherein a third plurality of reactant gas passageways are formed in the respective gas channeling blocks and extend to the bottom surface of the reactant gas distribution plate, and wherein the third plurality of reactant gas passageways are individually coupled in fluid flowing relation relative to each of the respective second reactant gas passageways formed in the reactant gas supply plate, and wherein the second reactant gas flows through the third plurality of reactant gas passageways, and wherein a fourth plurality of reactant gas passageways extend between the top and bottom surface of the reactant gas distribution plate and are coupled in fluid flowing relation relative to the first reactant gas and which flows therethrough; and a reactant gas delivery face plate having a top surface which is juxtaposed relative to the bottom surface of the reactant gas distribution plate, and an opposite bottom surface, and wherein a plurality of spaced gas enclosures are mounted on the top surface, and wherein a fifth plurality of reactant gas passageways are formed in the top surface of the reactant delivery face plate and are located within the respective gas enclosures, and which further extend to the bottom surface, thereof, and wherein the first reactant gas flows therethrough, and wherein a sixth plurality of reactant gas passageways are formed in the top surface of the reactant gas delivery face plate and are located between the plurality of gas enclosures, and which extend to the bottom surface thereof, and wherein the second reactant gas flows therethrough, and wherein the first and second reactant gases exit the bottom surface of the reactant delivery face plate in a substantially equally distributed fashion.

Still another aspect of the present invention relates to a gas distribution assembly which includes a first, second and third gas distribution plate which are joined together, and wherein the second gas distribution plate is located between the first and third gas distribution plates, and wherein a first cavity is defined between the first and second gas distribution plates, and a second cavity is defined between the second and third gas distribution plates, and wherein a plurality of reactant gases are coupled in fluid flowing relation relative to the respective gas distribution plates; a plurality of first gas partition means for receiving and channeling a first reactant gas, and which is made integral with and extends upwardly from the second gas distribution plate, and wherein the respective first gas partition means are further located in predetermined spaced relation one relative to the others, and wherein the plurality of first gas partition means are further disposed in juxtaposed relation relative to the first gas distribution plate and are located within the first cavity; a plurality of first reactant gas passageways which are defined, at least in part, by the plurality of first gas partition means and which extend through the second gas distribution plate, and which receives and channels the first reactant gas; a plurality of second reactant gas passageways defined by the second gas distribution plate, and which extend therethrough, and which are further substantially evenly distributed around the first gas partition means, and which receives and channels a second reactant gas; a plurality of second gas partition means for receiving and channeling the second reactant gas and which is made integral with and extends upwardly from the third gas distribution plate, and wherein the respective second gas partition means are located in predetermined spaced relation one relative to the others, and wherein the second gas partition means are further disposed in juxtaposed relation relative to the second gas distribution plate, and further are located within the second cavity; a plurality of third reactant gas passageways which are defined, at least in part, by the plurality of second gas partition means and which extend through the third gas distribution plate, and which receives and channels the second reactant gas; a plurality of fourth reactant gas passageways which are defined by the third gas distribution plate and which extend therethrough, and which are further substantially evenly distributed around the plurality of second gas partition means, and which receives and channels the first reactant gas, and wherein first and second reactant gas pathways are defined by the first, second, third and fourth reactant gas passageways, and wherein a first and a second reactant gas moves along the first and second reactant gas pathways and remain separated, one from the other, until they exit the third gas distribution plate.

Still another aspect of the present invention relates to a semiconductor work piece processing reactor which includes a processing chamber defining a deposition region; a moveable pedestal which horizontally supports and moves a semiconductor work piece to be processed within the deposition region of the processing chamber while in processing; and a gas distribution assembly mounted within the processing chamber and adjacent to the semiconductor work piece, and wherein the gas distribution assembly has multiple reactant gas distribution plates, and wherein the respective reactant gas distribution plates define a plurality of reactant gas passageways which are coupled together in predetermined fluid flowing relation so as to provide at least first and second reactant gas pathways which are separated from each other, and which deliver at least two reactant gases to the moveable semiconductor work piece.

These and other aspects of the present invention will be described in greater detail hereinafter.

BRIEF DESCRIPTION OF THE DRAWINGS

Preferred embodiments of the invention are described below with reference to the following accompanying drawings.

FIG. 7 is a top plan view of a reactant gas delivery face plate which forms a feature of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
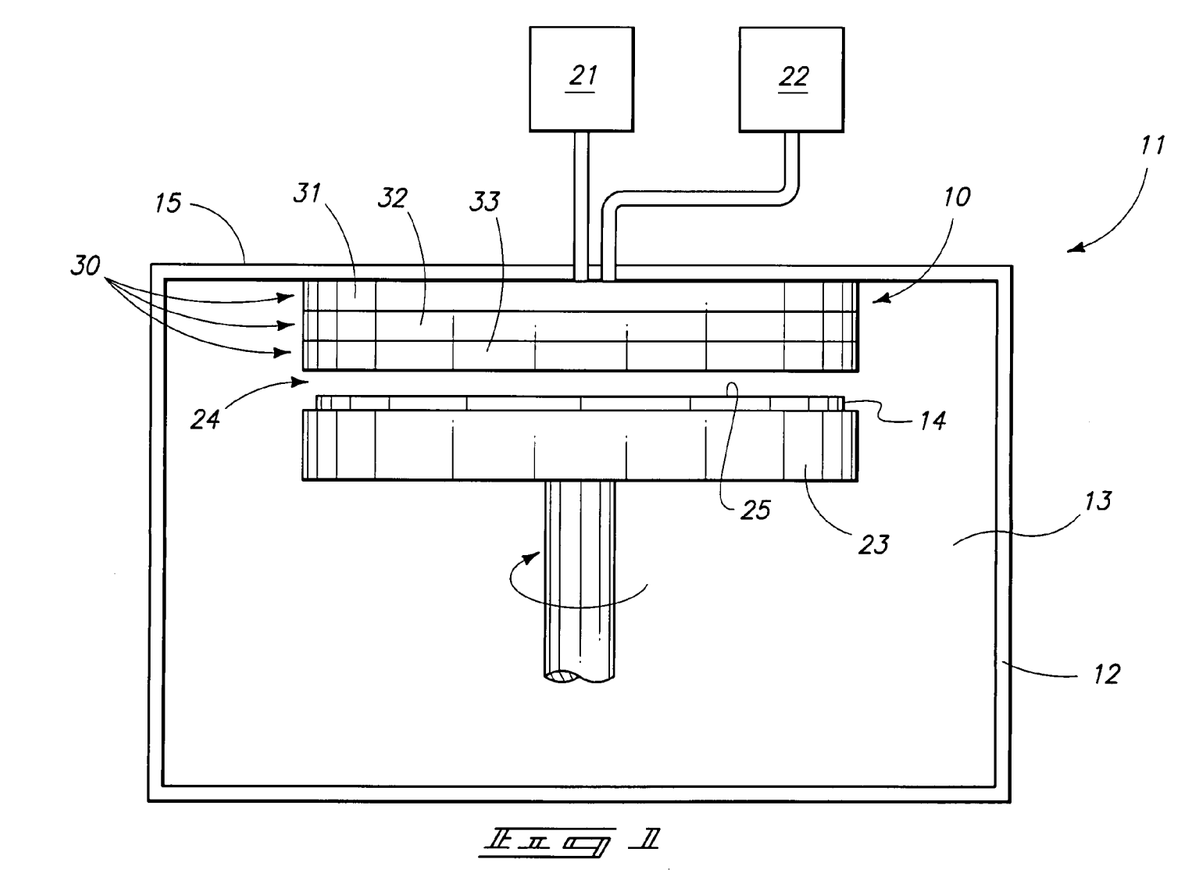
FIG. 1 is a greatly simplified transverse, vertical, sectional view of a semiconductor work piece processing reactor incorporating the features of the present invention.

A gas distribution assembly 10 for use in a semiconductor work piece processing reactor is seen in the greatly simplified view of FIG. 1. The present invention may be used for both chemical and vapor deposition (CVD); or atomic layer deposition (ALD) as will become more apparent in the paragraphs which follow. As illustrated therein, the gas distribution assembly 10 is incorporated or otherwise positioned within a processing chemical vapor deposition (CVD) chamber and which is generally designated by the numeral 11. The processing or CVD chamber 11 has a circumscribing sidewall 12 which defines an internal chamber 13, and which receives and processes a semiconductor wafer, or semiconductor work piece which is generally designated by the numeral 14. In the arrangement as seen in FIG. 1, the processing or CVD chamber 11 has a top surface 15, and a plurality of reactant materials, here indicated as a first reactant material 21, and a second reactant material 22, respectively, are coupled in fluid flowing relation relative to the gas distribution assembly 10. In the discussion which follows, and in one aspect of the invention, it should be understood that the first and second reactant materials will be described as TEOS and Ozone. The TEOS and Ozone are coupled in fluid flowing relation relative to the gas distribution assembly 10. Further, the gas distribution assembly 10 can be used to deposit metal. When employed for this purpose, the first and second reactant materials may comprise $TiCl_4$ and $NH_3$. When the gas distribution assembly is employed for ALD it may deposit high k materials such as $Al_2O_3$, $HFSiO_2$, and $TA_2O_5$ for example. Other sources of first and second reactant materials which may be employed, for example, to deposit a WN film by either CVD or ALD includes materials such as, for example, $WF_6$ and $NH_3$. Moreover, the first and second reactant materials which may be utilized to deposit a layer TaN, or Tin, includes Ta/Ti and a Nitrogen precursor. It should also be understood that various valves and other control assemblies (not shown) are typically utilized to meter these first and second reactant materials (21 and 22) in various amounts to the gas distribution assembly 10. As further seen in FIG. 1, a support member or pedestal 23 is utilized to support the semiconductor work piece 14 in a substantially horizontal orientation therebetween the gas distribution assembly 10 and the pedestal 23. The pedestal, or support member 23 can be fabricated to include a heating element which is selected from the group comprising a resistive heating element; a coil inductive heating element; a lamp heating element and other heating means which are operable to impart heat energy to the semiconductor work piece 14. The pedestal 23, in one form of the invention, is arranged so as to rotate the semiconductor work piece 14 at a predetermined rotational speed.

Additionally, it should be recognized that the pedestal may be rendered horizontally moveable. In this regard, the horizontal movement may include rotational, dithering, reciprocal, non-linear and combinations of the foregoing. The horizontal movement of the pedestal 23 is employed, at least in part, to enhance the uniformity of any layers of material deposited on a semiconductor work piece 14, being processed. In combination, the gas distribution assembly 10 and the horizontally moveable pedestal 23 improve the resulting film thickness uniformity on the semiconductor work piece 14 and further increases the gap fill capability; reduces the generation of particles; and also reduces the volume of reactant gases employed in a given process. The semiconductor work piece 14 is positioned within a reaction zone or deposition region 24 which is positioned between the gas distribution assembly 10, and the pedestal 23 upon which the semiconductor work piece rests. It should be understood that the present invention 10 may be deployed in an arrangement as illustrated in FIG. 1, or in a multiple work station processing or CVD chamber where several semiconductor work pieces 14 are processed substantially simultaneously in the different work stations. Therefore, in its broadest aspect, the present invention relates to a semiconductor work piece 14 processing reactor which includes a processing chamber 11 defining a deposition region 24; a rotatable pedestal 23 which horizontally supports and moves a semiconductor work piece 14 to be processed within the deposition region 24 of the processing chamber 11 while in processing; and a gas distribution assembly 10 mounted within the processing chamber 11 and adjacent to the semiconductor work piece 14, and which delivers two reactant gasses here identified as a first and second reactant gas 21 and 22 to the rotating semiconductor work piece 14, and wherein the two reactant gases remain separated as they pass through the gas distribution assembly 10.

Figure 2:
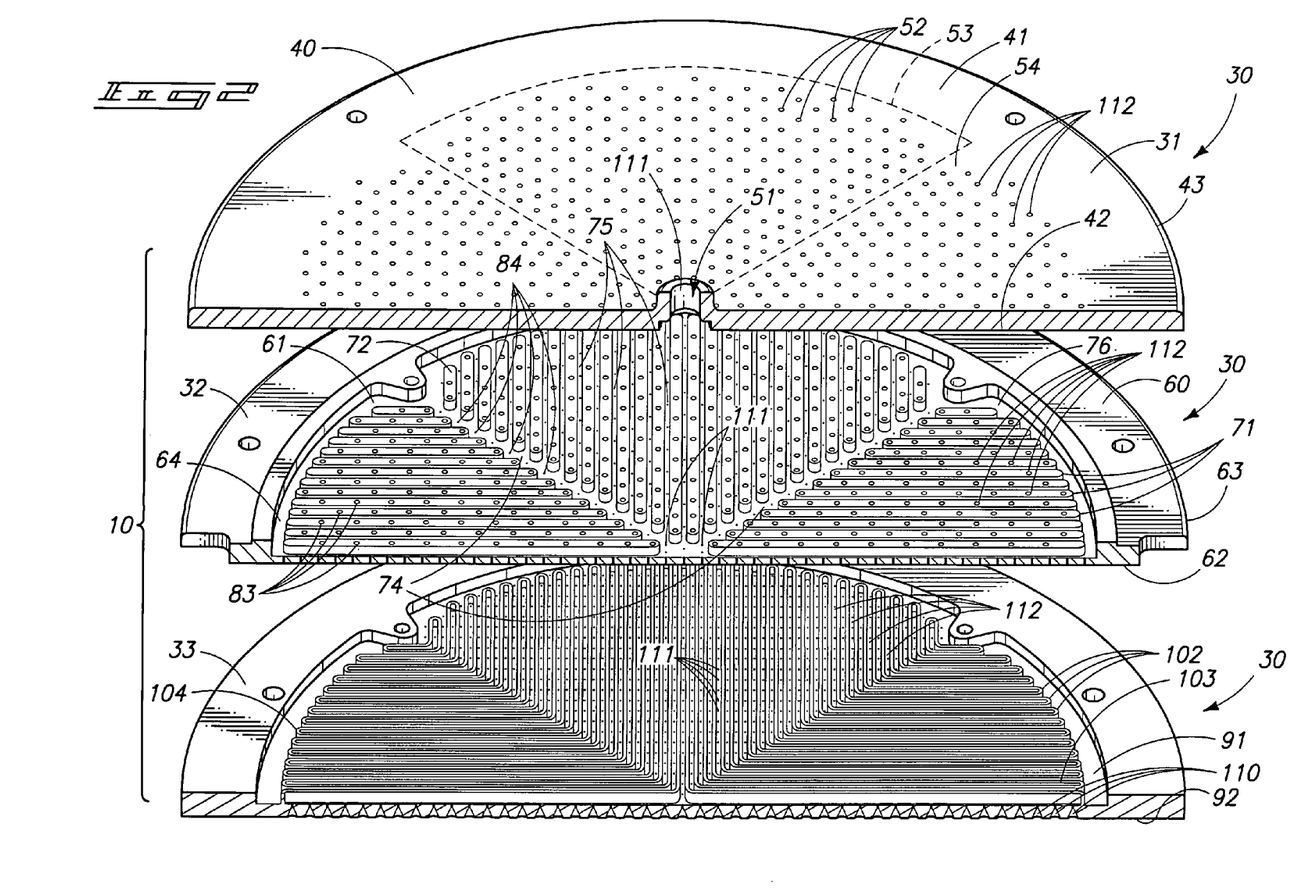
FIG. 2 is an exploded, transverse, vertical, sectional view of a gas distribution assembly for use in semiconductor work piece processing and which incorporates the features of the present invention.
Figure 3:
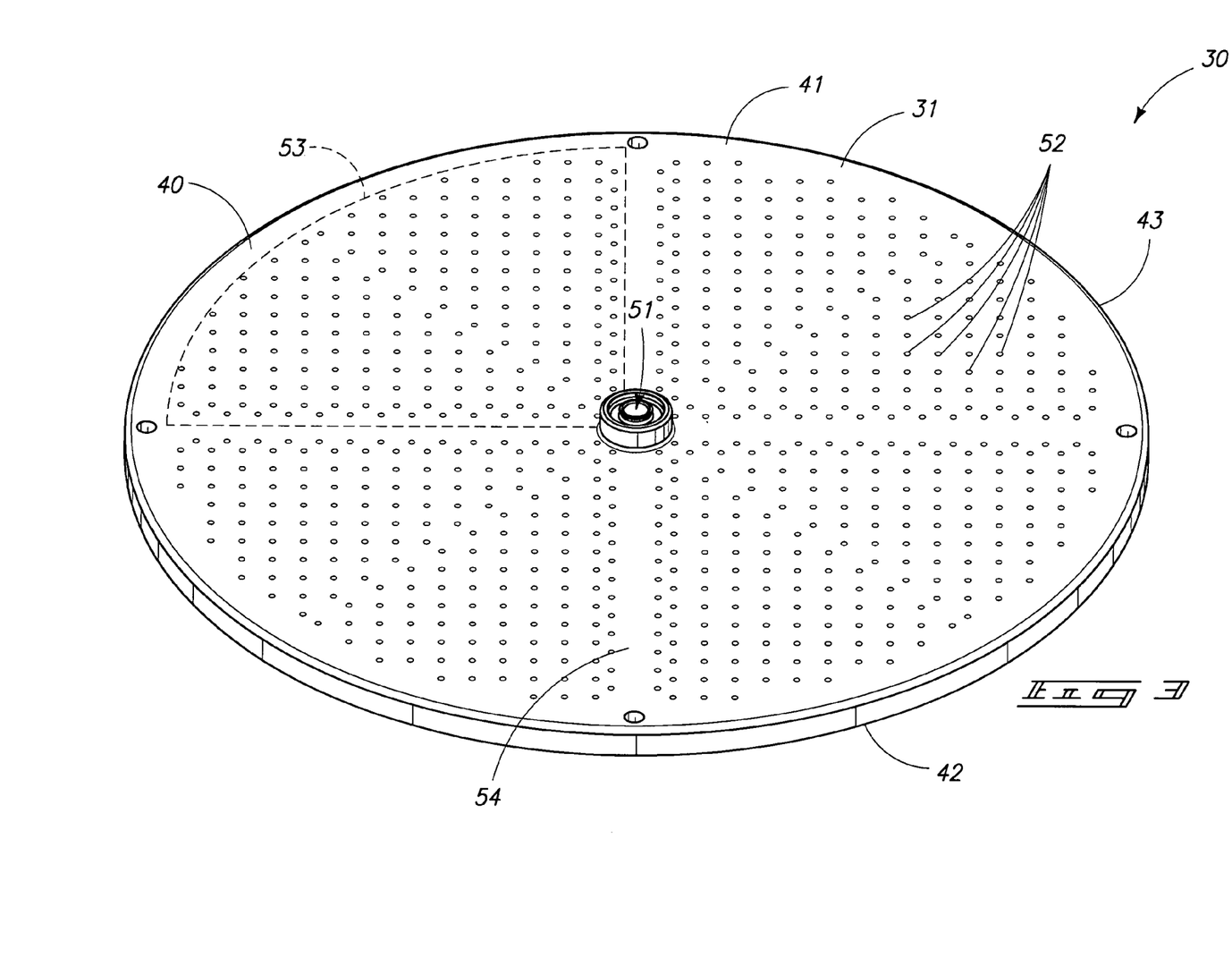
FIG. 3 is a fragmentary, perspective, top plan view of a reactant gas supply plate which forms a feature of the present invention.
Figure 4:
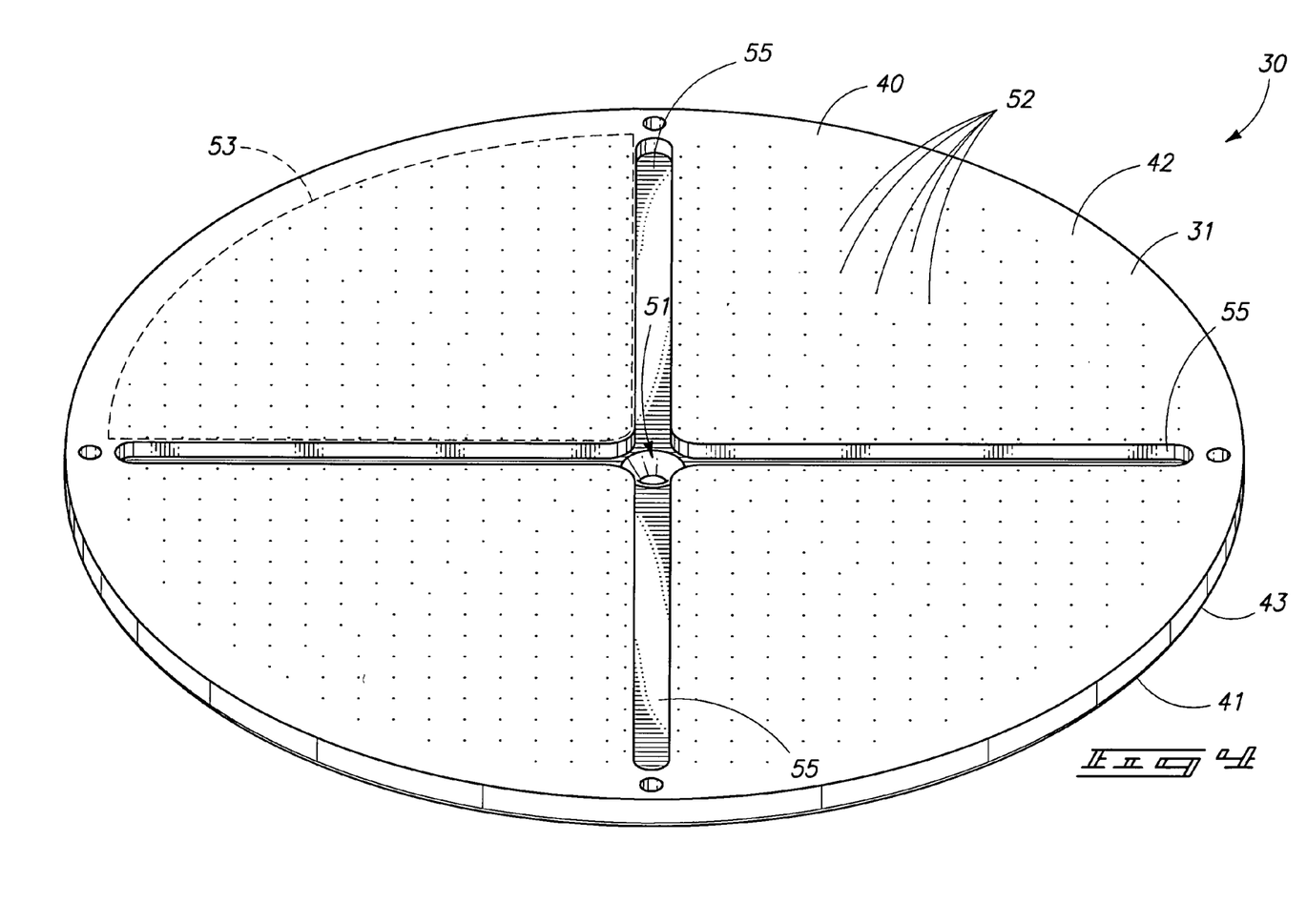
FIG. 4 is a fragmentary, perspective, bottom plan view of a reactant gas supply plate which forms a feature of the present invention.

Referring now to FIG. 2, the gas distribution assembly 10 is shown in a perspective, exploded, transverse, vertical, sectional view. This drawing reveals that the gas distribution assembly 10 includes a plurality of gas distribution plates which are generally designated by the numeral 30. In this regard, the plurality of gas distribution plates 30 are identified herein as a first reactant gas distribution plate or reactant gas supply plate 31; a second reactant gas distribution plate 32; and a third reactant gas distribution plate or third reactant gas delivery face plate which is generally designated by the numeral 33. In the arrangement as seen in the drawings, the respective first reactant gas distribution plate, second gas distribution plate, and third reactant gas delivery face plate are, in one form of the invention, mechanically coupled together, or in another form of the invention, brazed or fused together into a unitary assembly. As seen most clearly by reference to FIGS. 3 and 4, and which depict both the top plan, and the bottom plan perspective views of the first reactant gas distribution plate or reactant gas supply plate 31, it will be understood that this first reactant gas distribution plate 31, of the gas distribution assembly 10, has a main body 40 having a top surface 41, an opposite bottom surface 42, and a peripheral edge which is generally designated by the numeral 43. The main body 40 defines a first reactant gas passageway 51 which is disposed or formed substantially centrally of the main body, and which extends between the top and bottom surfaces 41 and 42, respectively. Still further, a plurality of second reactant gas passageways 52 are formed in the reactant gas supply plate 31 and which extend between the top and bottom surfaces 41 and 42 thereof. In the present application, the word "passageway" shall be construed in its broadest sense, and not be limited to the illustrated geometries as seen in the drawings. Therefore, the aforementioned passageways may include round holes as illustrated, or further could have a slot like shape, among others. In the arrangement as seen in these drawings, the first reactant gas 21 is coupled in fluid flowing relation relative to the first reactant gas passageway 51, and the second reactant gas 22 is coupled in fluid flowing relation relative to the plurality of second reactant gas passageways 52. In the arrangement as seen in FIG. 2, the first, second and third reactant gas distribution plates 31, 32 and 33, respectively, define a plurality of reactant gas passageways, as will be described in greater detail hereinafter, and which are coupled together in predetermined fluid flowing relation so as to provide first and second reactant gas pathways which are separated from each other and which deliver the two reactant gasses 21 and 22 to the rotating semiconductor work piece 14 as seen in FIG. 1. As seen in FIGS. 1-4, it will be understood that the first reactant gas 21 comprises TEOS which is delivered to the first reactant gas passageway 51, and the second reactant gas 22 comprises Ozone which is delivered to the plurality of second reactant gas passageways 52. Other first and second reactant gases may be selected as was discussed earlier in the application. As illustrated in FIGS. 3 and 4, it will be recognized that the plurality of second reactant gas passageway 52 are distributed in a plurality of predetermined spaced zones 53. Further, elongated, substantially continuous gaps 54 are oriented therebetween respective zones 53. Referring now to FIG. 4 which shows a bottom plan view of the first reactant gas distribution plate or reactant gas supply plate 31, it will be seen that a plurality of radially extending gas channeling passageways 55 are located between the first plurality of predetermined zones 53; and the first reactant gas passageway 51 is coupled in fluid flowing relation relative to the plurality of radially extending gas channeling passageways 55. As seen, the respective gas channeling passageways 55 extend substantially from the central region of the main body 40 and in the direction of the peripheral edge 43, thereof.

Figure 5:
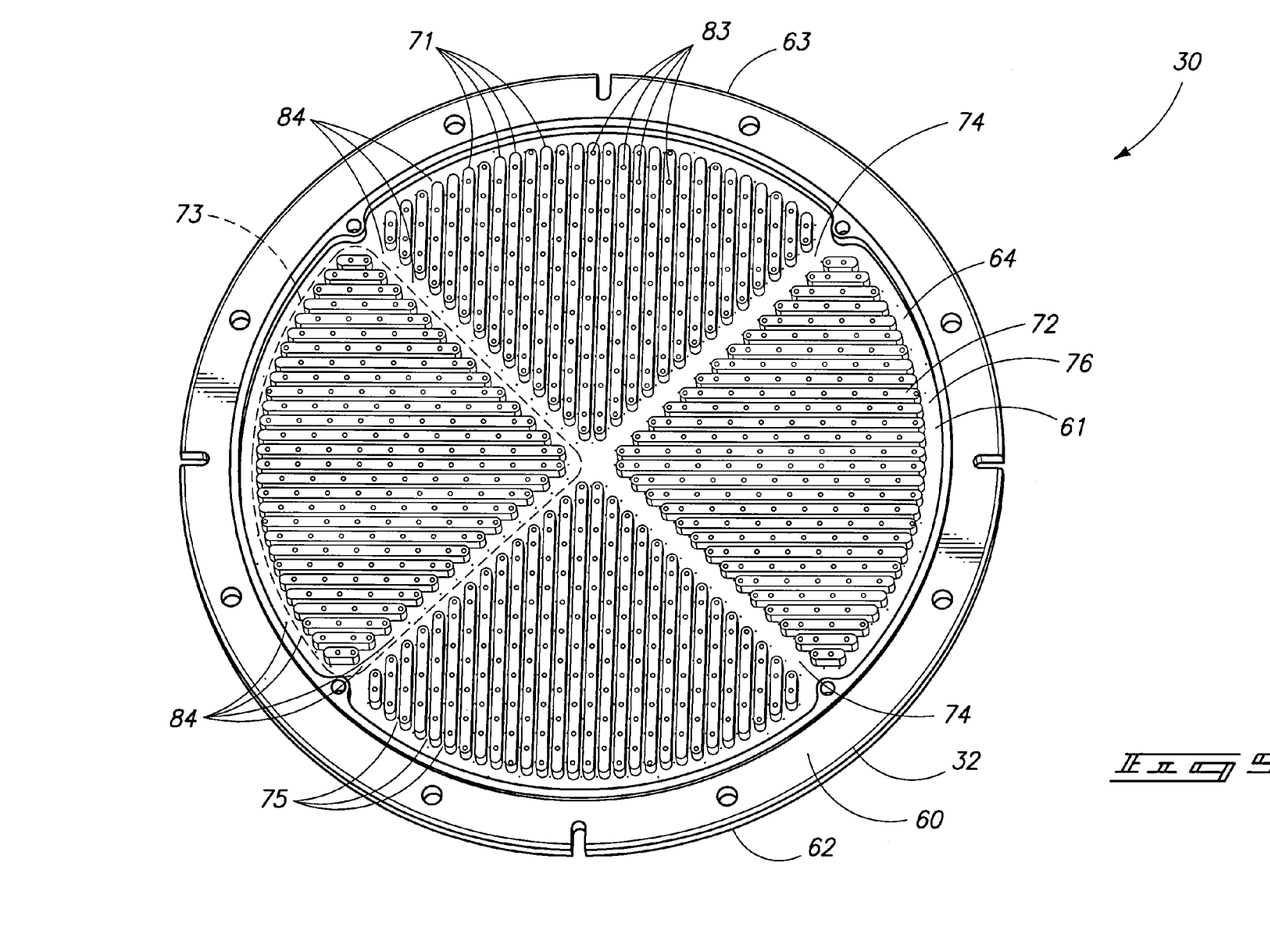
FIG. 5 is a top plan view of a reactant gas distribution plate which forms a feature of the present invention.
Figure 6:
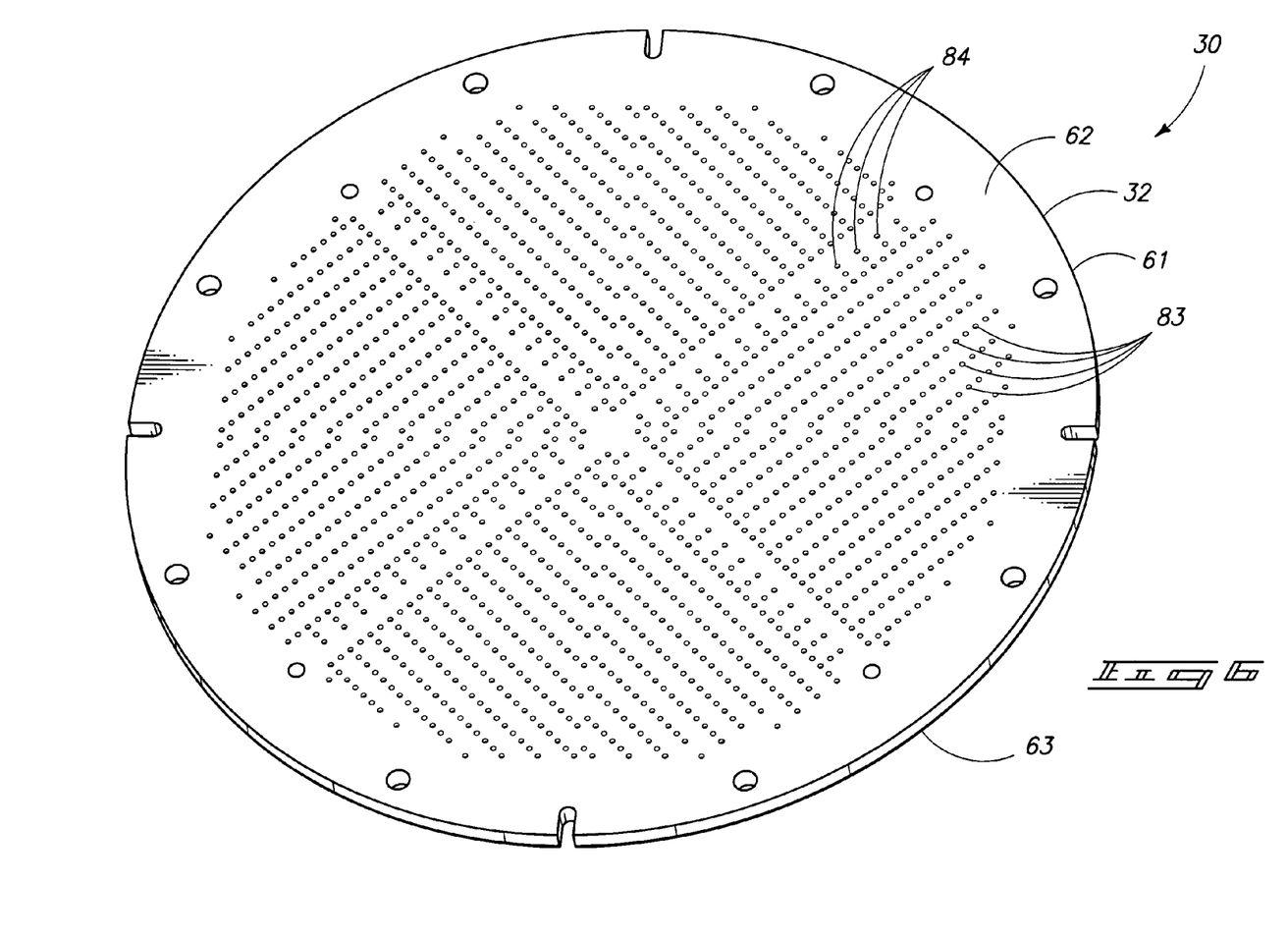
FIG. 6 is a bottom plan view of a reactant gas distribution plate which forms a feature of the present invention.

The first, second and third gas distribution plates 31, 32 and 33, respectively, are sealably joined together as earlier disclosed. Further, as seen in FIG. 2 and following, the second gas distribution plate 32 is located between the first and third gas distribution plates 31 and 33. In this regard, the second gas distribution plate 32 has a substantially circular main body 60 which has a top surface 61 and a bottom surface 62. Still further, the main body 60 has a peripheral edge 63. As will be appreciated from a study of FIGS. 2 and 5, for example, a cavity 64 is defined between the top surface 61, and the bottom surface 42 of the first reactant gas distribution plate or reactant gas supply plate 31. As best illustrated in FIGS. 2, 5 and 6, a first plurality of first gas partition means, or linearly elongated gas channeling blocks 71 are provided, and which are made integral with the main body 60, and which extend substantially normally upwardly relative to the top surface 61 thereof. This first plurality of first gas partition means, or the plurality of linearly elongated gas channeling blocks are disposed in predetermined spaced relation one relative to the others. Further, each of the gas channeling blocks have a top surface 72. When assembled, the top surface 72 is positioned in juxtaposed rested relation against the bottom surface 42 of the reactant gas supply plate 31. As best illustrated in FIG. 5, for example, the plurality of linearly elongated gas channeling blocks 71 are arranged in a second plurality of zones 73 that are individually substantially aligned with the first plurality of zones 53 that are defined in the reactant gas supply plate 31. Further, and located between the second plurality of zones 73 are a plurality of major radially extending reactant gas distribution passageways 74. Moreover, a plurality of minor reactant gas distribution passageways 75 are defined therebetween the respective linearly elongated gas channeling blocks and which are coupled in fluid flowing relation relative to the respective major radially extending reactant gas distribution passageways 74. Still further, a circumscribing gas distribution passageway 76 is provided, and which circumscribes the plurality of zones 73 formed from the plurality of linearly elongated gas channeling blocks 71, and is coupled in fluid flowing relation relative to the respective major and minor reactant gas passageways 74 and 75.

In the arrangement as seen in FIG. 5, a third plurality of reactant gas passageways 83 are formed in the respective linearly elongated gas channeling blocks and extend through the respective gas channeling blocks to the bottom surface 62 of the reactant gas distribution plate 32. The third plurality of reactant gas passageways 83 are individually coupled in fluid flowing relation relative to each of the second gas reactant gas passageways 52 which are formed in the reactant gas supply plate 31. Therefore, the second reactant gas 22 flows through the third plurality of reactant gas passageway 83. Still further, a fourth plurality of reactant gas passageways 84 are formed in, and extend between the top and bottom surfaces 61 and 62 of the reactant gas distribution plate 32. The respective fourth reactant gas passageways are coupled in fluid flowing relation relative to the first reactant gas 21 and which flows therethrough. As should be understood, the respective second reactant gas passageways 52 which are formed in the reactant gas supply plate 31 are substantially coaxially aligned relative to the third reactant gas passageways 83 which are formed in the respective gas channeling blocks 71. Therefore, the second reactant gas 22 passes through the plurality of coaxially aligned second and third reactant gas passageways 52 and 83 and exits the bottom surface 62 of the reactant gas distribution plate 32. As will be recognized from the drawings, the plurality of major radially extending reactant gas distribution passageways 74 are substantially coaxially aligned relative to the plurality of radially extending gas channeling passageways 55 which are formed in the bottom surface 42 of the reactant gas supply plate 31. As should be understood, therefore, the first reactant gas 21 exiting the reactant gas supply plate 31 travels along the major, minor and circumscribing reactant gas distribution passageways 74, 75 and 76, and then passes through the fourth plurality of reactant gas passageway 84 which are formed in the reactant gas distribution plate 32 and which extend between the top and bottom surfaces 61 and 62. As should be understood, and while traveling through the second reactant gas distribution plate, the first and second reactant gases 21 and 22 remain substantially separated. As seen by reference to FIG. 2 for example, it will be understood that the first plurality of first gas partition means or the plurality of linearly elongated gas channeling blocks 71 are received within the cavity 64 which is defined between the top surface 61, and the bottom surface 42 of the respective first and second reactant gas distribution plates 31 and 32, respectively. Additionally, and in another possible form of the invention (not shown), the aforementioned gas channeling blocks 71 can be replaced with a plurality of individually spaced gas guiding tubes or gas guiding means, which are attached to or coupled with the second gas distribution plate 32.

The gas distribution assembly 10 of the present invention includes a third reactant gas distribution plate or third reactant gas delivery face plate 33 which is best illustrated by reference to FIG. 7-10, respectively. In this regard, the third reactive gas distribution plate, or third reactive gas delivery face plate 33 has a main body 90 and which has a top surface 91, and a bottom surface 92. Still further, the main body is defined by a peripheral edge 93, and a cavity 94 is defined between the top surface 91 and the bottom surface 62 of the second reactive gas distribution plate 32. Made integral with, and extending substantially normally upwardly relative to the top surface 91 of the main body 90, is a plurality of second gas partition means or right angularly shaped gas enclosures which are generally indicated by the numeral 102. The generally right angularly shaped gas enclosures 102 are of various sizes and are disposed in predetermined spaced relation one relative to the others. The respective right angularly shaped gas enclosures 102 are defined by a substantially continuous sidewall 103. The sidewall 103 has a top peripheral edge 104. The top peripheral edges of the respective right angularly shaped gas enclosures 102 rest in juxtaposed relation thereagainst the bottom surface 62 of the second reactant gas distribution plate 32. As seen in FIG. 7, a fifth plurality of gas passageways 105 are located within the respective gas enclosures 102, and are formed in the top surface 91 and extend to the bottom surface 92 thereof. As should be understood, the first reactant gas 21 exiting the bottom surface 62 of the second reactant gas distribution plate 32 enters the respective gas distribution enclosures 102 and then passes out through the fifth plurality of reactant gas passageways 105 for delivery to the semiconductor work piece 14 which is being processed. Still further, a sixth plurality of gas distribution passageways 106 are defined by the third reactant gas delivery face plate 33, and are located therebetween the plurality of gas distribution enclosures 102. The sixth plurality of gas distribution passageways receives the second reactant gas 22 which is exiting the reactant gas distribution plate 32. The sixth plurality of gas passageways 106 are formed in the top surface 91 and extend to the bottom surface 92. As should be understood, the second reactant gas 22 is substantially evenly distributed over the top surface 92 of the reactant gas delivery face plate 33 and then passes through the sixth plurality of gas passageways 106 for delivery to the semiconductor work piece 14 which is being processed. The right angularly shaped gas enclosure 102 could, of course, be replaced, in yet another form of the invention, with a plurality of individually spaced gas guiding tubes or gas guiding means, (not shown), and which is attached to or coupled with the reactant gas delivery face plate 33.

Figure 8B:
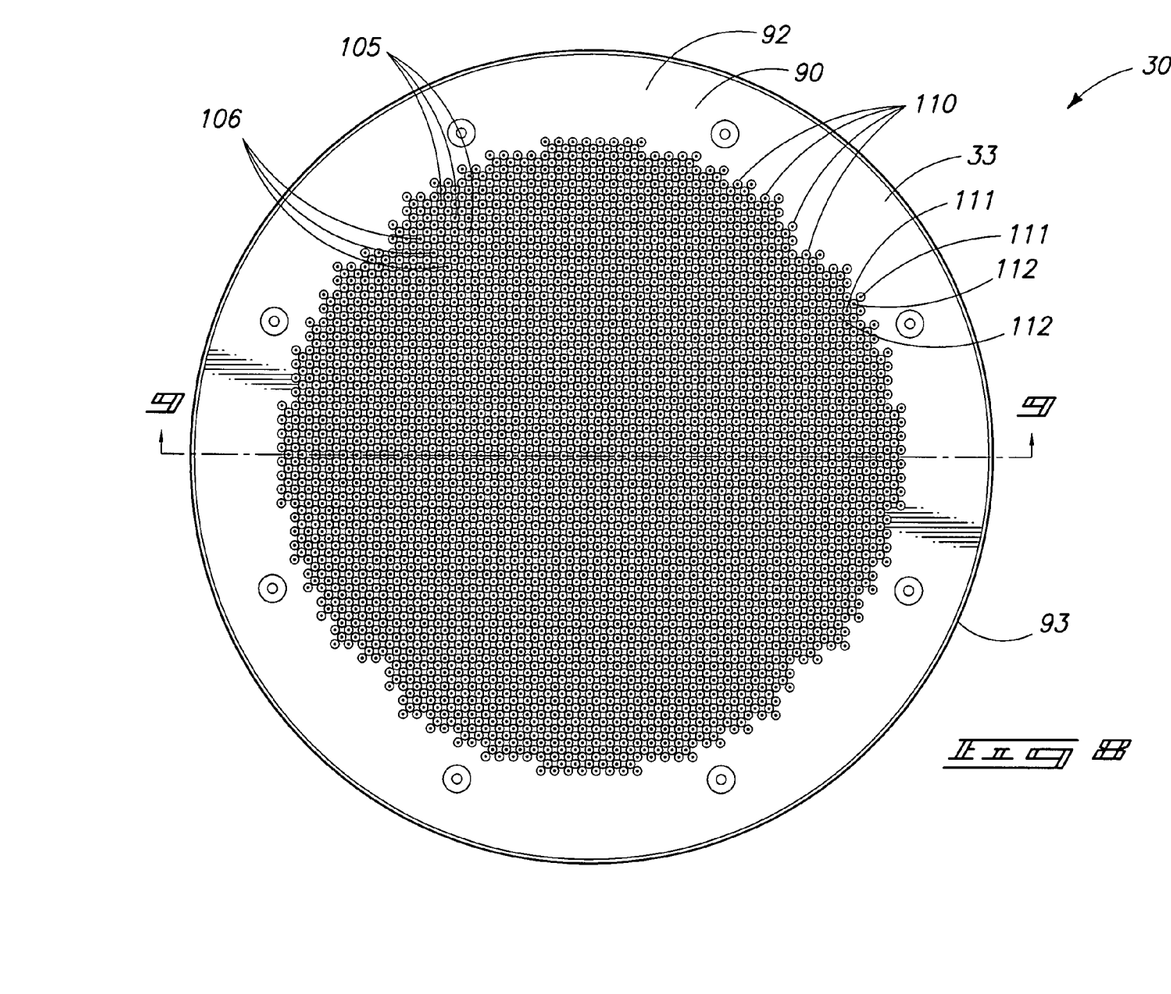
FIG. 8 is a bottom plan view of a reactant gas delivery face plate which forms a feature of the present invention.
Figure 9:
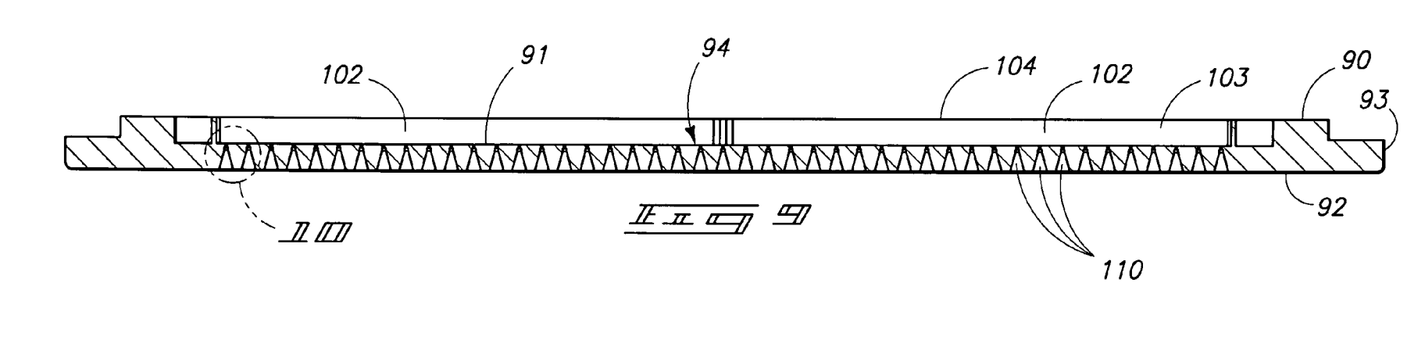
FIG. 9 is a transverse, vertical, sectional view taken through the reactant gas delivery face plate as seen in FIGS. 7 and 8.
Figure 10:
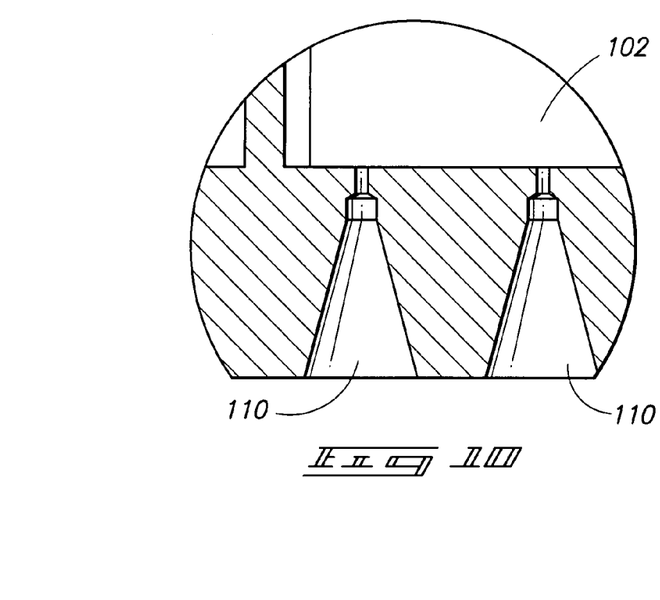
FIG. 10 is a fragmentary, greatly enlarged transverse, vertical sectional view taken from a position identified by the numeral 10 in FIG. 9.
Figure 11:
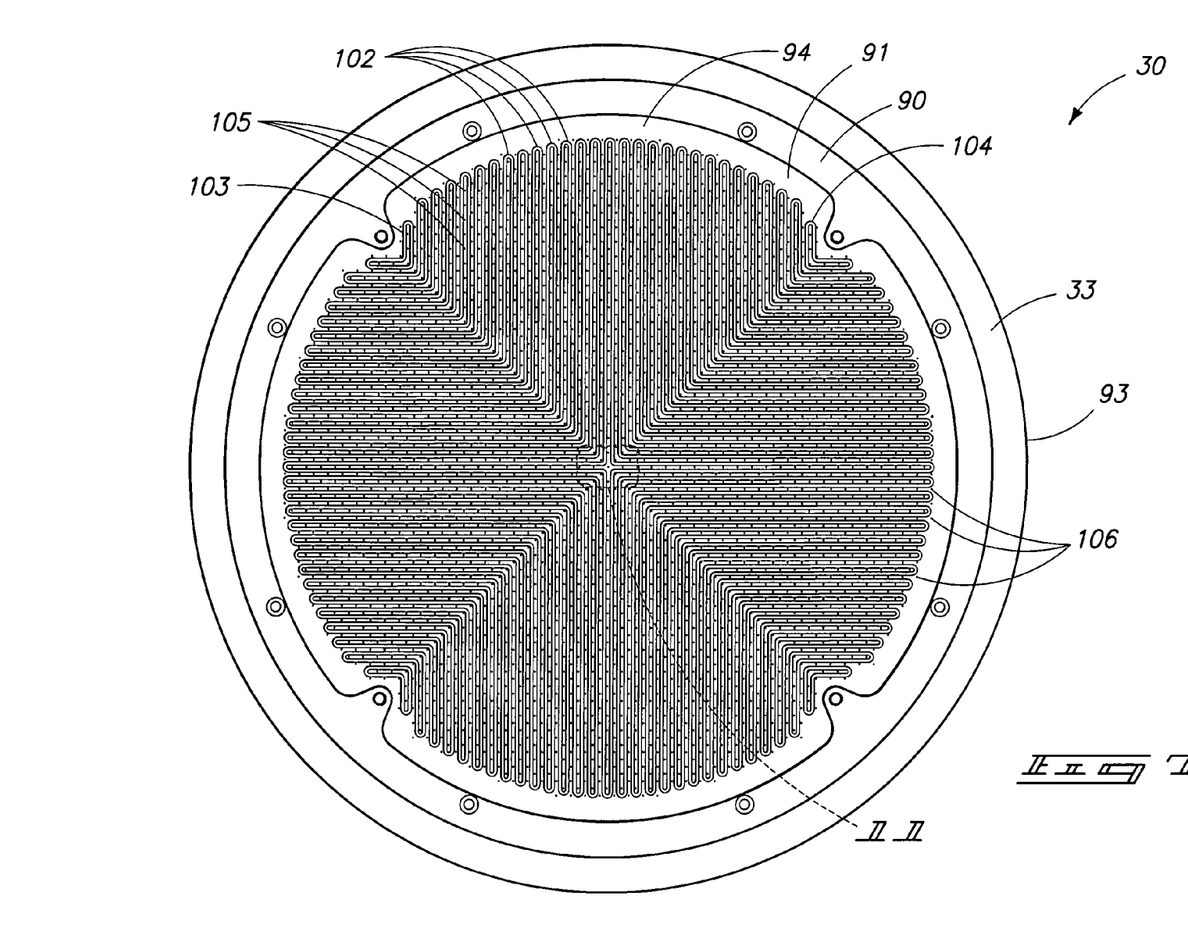
FIG. 11 is a greatly enlarged, fragmentary, top plan view of the reactant gas delivery face plate as seen in FIG. 7.

Referring now to FIGS. 8, 9 and 10, the fifth and sixth plurality of gas passageways 105 and 106 exit the bottom surface 92 of the reactant gas delivery plate 33 in an alternating, predetermined spaced orientation so as to substantially evenly distribute the first and second reactant gasses 21 and 22 to the semiconductor work piece 14 which is being processed. In this regard, the respective fifth and sixth gas passageways 105 and 106 terminate at a plurality of frustoconically shaped gas distribution holes 110 which are formed in the bottom surface 92. The plurality of gas distribution holes 110 includes a central gas distribution hole 110a (FIG. 11) which, in one form of the invention, is substantially coaxially aligned relative to a center of the semiconductor work piece 14 which is being processed. In an alternative form of the invention, the center gas distribution hole 110a is positioned in laterally offset relation relative to a center of the semiconductor work piece 14 which being processed. The location of this lateral offset is indicated by the numeral 110b. As should be understood from the foregoing discussion, the gas distribution assembly 10 of the present invention defines a first reactant gas pathway 111 which formed from first, fourth and fifth reactant gas passageways 51, 84 and 105 respectively; and a second reactant gas pathway 112 which is formed from the second, third and sixth reactant gas passageways 52, 83 and 106, respectively. In the arrangement as seen in the drawings, the first reactant gas 21 passes through the first reactant gas pathway 111, and the second reactant gas 22 passes along the second reactant gas pathway 112 and exits the bottom surface 92 in an alternating fashion so that the first and second gases are substantially evenly distributed over the bottom surface 92 thereof. In one form of the invention, substantially equal volumes of the first and second reactant gases 21 and 22 are delivered by the reactant gas delivery face plate 33 to the rotating semiconductor work piece 14 which is positioned nearby. In another form of the invention, unequal volumes of the first and second reactant gases 21 and 22 are delivered by the reactant gas delivery face plate 33 to the semiconductor work piece 14. The first and second reactant gases remain substantially separated and do not mix as they pass through the first, second and third reactant gas distribution plate 31, 32 and 33 before being delivered into the chemical reactant zone 24 which is located above the semiconductor work piece 14.

OPERATION

The operation of the described embodiment of the present invention is believed to be readily apparent, and is briefly summarized at this point.

In a first aspect of the present invention, a gas distribution assembly 10 for use in semiconductor processing includes a reactant gas supply plate 31 which is coupled in fluid flowing relation relative to a source of first and second reactant gases 21 and 22. Further, the gas distribution assembly 10 includes a reactant gas distribution plate 32 coupled in fluid receiving relation relative to the reactant gas supply plate 31. Still further, the gas distribution assembly 10 includes a reactant gas delivery face plate 33 which is coupled in fluid receiving relation relative to the reactant gas distribution plate 32. As earlier discussed, the first and second reactant gases 21 and 22 remain separated as they pass through the reactant gas supply plate 31, reactant gas distribution plate 32, and reactant gas delivery face plate 33, and then exit the reactant gas delivery face plate 33 in a substantially evenly distributed fashion for delivery to a rotating semiconductor work piece 14 which is being processed.

Another aspect of the present invention relates to a gas distribution assembly 10 for use in semiconductor processing which includes first, second and third gas distribution plates 31, 32 and 33, which are joined together, and wherein the second gas distribution plate 32 is located between the first and third gas distribution plates 31 and 33, respectively. In the arrangement as seen in the drawings, a first cavity 64 is defined between the first and second gas distribution plates 31 and 32, and a second cavity 94 is defined between the second and third gas distribution plates 32 and 33. In the arrangement as seen in the drawings, a plurality of first gas partition means 71 are made integral with, and extend upwardly from the second gas distribution plate 32, and which are further located in predetermined spaced relation one relative to the others. The plurality of first gas partition means 71 are further disposed in juxtaposed relation relative to the first gas distribution plate 31, and are also located within the first cavity 64. A plurality of first reactant gas passageways, and which were earlier described as the third reactant gas passageways 83 are defined by the plurality of first gas partition means 71. Still further, a plurality of second reactant gas passageways, and which were earlier described as the plurality of fourth reactant passageways 84 are defined by the second gas distribution plate 32, and which extend therethrough, and which are further substantially evenly distributed around the first gas partition means 71. The gas distribution assembly 10 of the present invention further includes a plurality of second gas partition means 102 which are made integral with, and extend upwardly from the third gas distribution plate 33, and are further located in predetermined spaced relation one relative to the others. In the arrangement as seen in the drawings, the second gas partition means 102 are further disposed in juxtaposed relation relative to the second gas distribution plate 32 and further are located within the second cavity 94. A plurality of third reactant gas passageways, and which were earlier described as the fifth plurality of reactant gas passageways 105 are defined, at least in part, by the plurality of second gas partition means 102 and which extend through the third gas distribution plate 33. Still further, a plurality of fourth reactant gas passageways, and which were earlier described as the sixth plurality of gas passageways 106 are defined by the third gas distribution plate 33, and which extend therethrough, and which are further substantially evenly distributed around the plurality of second gas partition means 102. As earlier described, the first and second reactant gas pathways 111 and 112 are defined by the plurality of reactant gas passageways, and wherein a first and a second reactant gas 21 and 22 moves along the first and second reactant gas pathways 111 and 112 and remain separated, one from the other, until they exit the third gas distribution plate 33.

Therefore, a semiconductor work piece processing reactor is described and which includes a processing chamber 11 defining a deposition region 24 and a rotatable pedestal 23 is provided, and which supports and rotates a semiconductor work piece 14 to be processed within the deposition region 24 of the processing chamber 11. Still further, the invention includes a gas distribution assembly 10 mounted within the processing chamber 11 and adjacent to the semiconductor work piece 14, and wherein the gas distribution assembly 10 has first, second and third reactant gas distribution plates 31, 32 and 33, respectively. The respective reactant gas distribution plates define a plurality of reactant gas passageways 51, 52, 83, 84, 105 and 106, respectively which are coupled together in predetermined fluid flowing relation so as to provide first and second reactant gas pathways 111 and 112 which are separated from each other, and which deliver two reactant gases 21 and 22 to the rotating semiconductor work piece 14.

As will be recognized, the present invention provides a convenient means whereby two reactant gasses may be conveniently delivered to a rotating semiconductor work piece in a manner not possible heretofore and which avoids many of the shortcomings attendant with the prior art teachings and other methodology utilized in the semiconductor industry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A gas distribution assembly, comprising:
a reactant gas supply plate which is coupled in fluid flowing relation relative to at least first and second reactant gases;
at least one reactant gas distribution plate coupled in fluid receiving relation relative to the reactant gas supply plate for substantially evenly distributing at least one of the first and second reactant gases and wherein the reactant gas distribution plate is located between the reactant gas supply plate, and a reactant gas delivery face plate, and wherein the reactant gas distribution plate has a top surface which is juxtaposed relative to the bottom surface of the reactant gas supply plate, and an opposite bottom surface which is juxtaposed relative to the reactant gas delivery plate, and wherein a plurality of gas channeling blocks are positioned in predetermined spaced relation on the top surface of the reactant gas distribution plate, and extend normally upwardly relative thereto, and wherein each of the gas channeling blocks have a third plurality of reactant gas passageways formed therein and which extend through the respective gas channeling blocks to the bottom surface of the reactant gas distribution plate, and wherein the plurality of gas channeling blocks are spaced in a predetermined pattern so as to define a first plurality of major substantially radially extending reactant gas distribution passageways, and wherein the plurality of gas channeling blocks further define a plurality of minor reactant gas distribution passageways therebetween the respective gas channeling blocks; and
the reactant gas delivery face plate coupled in fluid receiving relation relative to the reactant gas distribution plate, and wherein the first and second reactant gases remain separated as they pass through the reactant gas supply plate, gas distribution plate and gas delivery face plate and then further exit the reactant gas delivery face plate in a substantially evenly distributed fashion.

2. A gas distribution assembly as claimed in claim 1, and wherein the reactant gas supply plate has a top and a bottom surface, and wherein a first reactant gas passageway is disposed substantially centrally thereof, and extends between the top and bottom surfaces, and wherein a plurality of second reactant gas passageways are formed in the reactant gas supply plate, and extend between the top and bottom surfaces thereof, and wherein the first reactant gas is coupled in fluid flowing relation relative to the first reactant gas passageway, and the second reactant gas is coupled in fluid flowing relation relative to the plurality of second reactant gas passageways.

3. A gas distribution assembly as claimed in claim 2, and wherein a first plurality of radially extending gas channeling passageways are formed in the bottom surface of the reactant gas supply plate, and which are each coupled in fluid flowing relation relative to the first reactant gas passageway, and wherein the first and second reactant gases exiting the bottom surface of the reactant gas supply plate are separated one from the other.

4. A gas distribution assembly as claimed in claim 3, and wherein the reactant gas supply plate has a surface area, and an outside peripheral edge, and wherein the first plurality of radially extending gas channeling passageways extend radially outwardly toward the peripheral edge of the reactant gas supply plate, and the plurality of second reactant gas passageways are substantially evenly distributed over the remaining surface area of the reactant gas supply plate.

5. A gas distribution assembly as claimed in claim 2, and wherein the third plurality of reactant gas passageways formed in the respective gas channeling blocks are individually coaxially aligned relative to each of the second plurality of reactant gas passageways which are formed in the reactant gas supply plate.

6. A gas distribution assembly as claimed in claim 5, further comprising a circumscribing reactant gas distribution passageway which is coupled to the first plurality of major radially extending gas distribution passageways and which surrounds the plurality of gas channeling blocks, and wherein the respective gas channeling blocks are coupled in fluid flowing relation relative to the first plurality of major radially extending reactant gas distribution passageways, and wherein a fourth plurality of reactant gas passageways are formed in the top surface of the reactant gas distribution plate, and are further located in predetermined substantially evenly distributed relation therealong the major, minor and circumscribing reactant gas distribution passageways and which further extend to the bottom surface of the reactant gas distribution plate, and wherein the first reactant gas which exits the reactant gas supply plate is substantially evenly distributed by the major, minor and circumscribing reactant gas distribution passageways over the top surface of the reactant gas distribution plate, and further enters into the fourth plurality of reactant gas distribution passageways and then exits the bottom surface to the reactant gas distribution plate, and wherein the first and second reactant gases remain separated as each of the reactant gases pass through the reactant gas distribution plate.

7. A gas distribution assembly as claimed in claim 2, and wherein the reactant gas delivery face plate has a top surface which is juxtaposed relative to the reactant gas distribution plate and which receives the first and second reactant gases which have passed through the reactant gas supply plate and the reactant gas distribution plate, and an opposite bottom surface which is disposed in spaced relation relative to a semiconductor work piece which is being processed, and wherein a plurality of gas distribution enclosures are mounted on the top surface and extend substantially normally upwardly thereof, and wherein the plurality of gas distribution enclosures are positioned in predetermined spaced relation, one relative to the others, and wherein a fifth plurality of gas passageways are formed in the top surface, and extend to the bottom surface thereof, and wherein the first reactant gas exiting the bottom surface of the reactant gas distribution plate enters the respective gas distribution enclosures and then passes out through the fifth plurality of gas passageways for delivery to the semiconductor work piece which is being processed, and wherein a sixth plurality of gas distribution passageways are defined therebetween the plurality of gas distribution enclosures and which receives the second reactant gas which is exiting the reactant gas distribution plate, and wherein the sixth plurality of gas passageways are formed in the top surface and extend to the bottom surface, and wherein the second reactant gas is substantially evenly distributed over the top surface of the reactant gas delivery face plate, and passes through the sixth plurality of gas passageways for delivery to the semiconductor work piece being processed.

8. A gas distribution assembly as claimed in claim 7, and wherein the fifth and sixth plurality of gas passageways exit the bottom surface of the reactant gas delivery face plate in an alternating, predetermined, spaced orientation so as to substantially evenly distribute the first and second reactant gases to the semiconductor work piece being processed.

9. A gas distribution assembly as claimed in claim 7, and wherein a plurality of gas distribution holes are formed in the reactant gas delivery face plate, and wherein the respective fifth and sixth gas passageways terminate at the plurality of gas distribution holes, and wherein the plurality of gas distribution holes has a center gas distribution hole which is substantially coaxially aligned relative to a center of the semiconductor work piece which is being processed.

10. A gas distribution assembly as claimed in claim 7, and wherein a plurality of gas distribution holes are formed in the reactant gas delivery face plate, and wherein the respective fifth and sixth gas passageways terminate at the plurality of gas distribution holes, and wherein the plurality of gas distribution holes has a center gas distribution hole which is positioned in laterally offset relation relative to a center of the semiconductor work piece which is being processed.

11. A gas distribution assembly as claimed in claim 1, and wherein the reactant gas supply plate, gas distribution plate and gas delivery face plate are mechanically coupled together.

12. A gas distribution assembly as claimed in claim 1, and wherein the reactant gas supply plate, gas distribution plate and gas delivery face plate are brazed or fused into a unitary gas distribution assembly.

13. A gas distribution assembly, comprising:
a reactant gas supply plate coupled in fluid flowing relation relative to at least a first and second reactant gas supply, and wherein the reactant gas supply plate has a top and a bottom surface, and wherein a first reactant gas passageway is formed substantially centrally thereof and extends between the top and bottom surfaces, and wherein the first reactant gas is coupled in fluid flowing relation relative to the first reactant gas passageway, and further exits the bottom surface thereof, and wherein a plurality of second reactant gas passageways are formed in the top surface and extend to the bottom surface thereof, and wherein the plurality of second reactant gas passageways are distributed in a first plurality of predetermined, spaced zones about the top surface thereof, and wherein the second reactant gas is in fluid flowing relation relative to the second reactant gas passageway, and further exits the bottom surface thereof;

a reactant gas distribution plate having a top surface which is juxtaposed relative to the bottom surface of the reactant gas supply plate, and an opposite bottom surface, and wherein the top surface of the reactant gas distribution plate has a plurality of spaced gas channeling blocks which are arranged in a second plurality of zones that are individually substantially aligned with the first plurality of zones formed in the reactant gas supply plate, and wherein a third plurality of reactant gas passageways are formed in the respective gas channeling blocks and extend to the bottom surface of the reactant gas distribution plate, and wherein the third plurality of reactant gas passageways are individually coupled in fluid flowing relation relative to each of the respective second reactant gas passageways formed in the reactant gas supply plate, and wherein the second reactant gas flows through the third plurality of reactant gas passageways and further exits the bottom surface thereof, and wherein a fourth plurality of reactant gas passageways are formed in the gas channeling blocks and extend between the top and bottom surface of the reactant gas distribution plate and are coupled in fluid flowing relation relative to the first reactant gas and which flows therethrough and further exits the bottom surface thereof; and a reactant gas delivery face plate having a top surface which is juxtaposed relative to the bottom surface of the reactant gas distribution plate, and an opposite bottom surface, and wherein a plurality of spaced gas enclosures are mounted on the top surface, the gas enclosures are defined by a substantially continuous sidewall, the sidewall having a top peripheral edge, the top peripheral edge of the gas enclosures rests in juxtaposed relation against the bottom surface of the reactant gas distribution plate, and wherein a fifth plurality of reactant gas passageways are formed in the top surface of the reactant delivery face plate and are located within the respective gas enclosures, and which further extend to the bottom surface, thereof, and wherein the first reactant gas flows therethrough, and wherein a sixth plurality of reactant gas passageways are formed in the top surface of the reactant gas delivery face plate and are located outside and between the plurality of gas enclosures, and which extend to the bottom surface thereof, and wherein the second reactant gas flows therethrough, and wherein the first and second reactant gases exit the bottom surface of the reactant delivery face plate in a substantially equally distributed fashion, and wherein a first reactant gas pathway is defined by the first, fourth and fifth reactant gas passageways, a second reactant gas pathway is defined by the second, third and sixth reactant gas passageways, and wherein a first and a second reactant gas moves along the first and second reactant gas pathways, respectively, and remain separated, one from the other, until the first and second reactant gases exit the reactant gas delivery face plate.

14. A gas distribution assembly as claimed in claim 13, and wherein the first and second reactant gases remain substantially separated as they pass through the reactant gas supply plate, reactant gas distribution plate, and the reactant gas delivery face plate.

15. A gas distribution assembly as claimed in claim 13, and wherein a plurality of radially extending gas channeling passageways are formed in the bottom surface of the reactant gas supply plate, and are further located between the first plurality of predetermined spaced zones, and wherein the first reactant gas passageway carrying the first reactant gas is coupled in fluid flowing relation relative to the plurality of radially extending gas channeling passageways.

16. A gas distribution assembly as claimed in claim 15, and wherein a plurality of major radially extending reactant gas distribution passageways are defined between the second plurality of zones as defined in the top surface of the reactant gas distribution plate, and wherein a plurality of minor reactant gas distribution passageways are defined between the respective gas channeling blocks, and wherein a circumscribing reactant gas distribution passageway is formed in the top surface of the reactant gas distribution plate, and which further surrounds the second plurality of zones as defined by the plurality of gas channeling blocks, and is further coupled in fluid flowing relation relative to the major radially extending reactant gas distribution passageways, and wherein the respective major radially extending reactant gas distribution passageways are substantially coaxially aligned relative to the individual radially extending gas channeling passageways formed in the bottom surface of the reactant gas supply plate, and wherein the first reactant gas exits the reactant gas supply plate and travels along the major and minor gas distribution passageways, and the circumscribing gas distribution passageway, and wherein the fourth plurality of gas passageways are located in predetermined spaced relation therealong the major and minor reactant gas distribution passageways, and circumscribing reactant gas distribution passageway, and wherein the first reactant gas exits the reactant gas distribution plate by way of the fourth plurality of gas passageways.

17. A gas distribution assembly as claimed in claim 13, and wherein the first and second reactant gases react following their exit from the bottom surface of the reactant gas delivery face plate, and are then delivered to a semiconductor work piece which is being processed.

18. A gas distribution assembly, comprising:

a first, second and third gas distribution plate which are joined together, and wherein the second gas distribution plate is located between the first and third gas distribution plates, and wherein a first cavity is defined between the first and second gas distribution plates, and a second cavity is defined between the second and third gas distribution plates, and wherein a plurality of reactant gases are coupled in fluid flowing relation relative to the respective gas distribution plates;

a plurality of linearly elongated first gas partition means for receiving and channeling a first reactant gas, and which is made integral with and extends normally upwardly relative to a top surface of the second gas distribution plate, and wherein the respective first gas partition means are further located in predetermined spaced relation one relative to the others, and wherein the plurality of first gas partition means are further disposed in juxtaposed relation relative to the first gas distribution plate and are located within the first cavity;

a plurality of first reactant gas passageways which are defined, at least in part, within the plurality of first gas partition means and which extend through the second gas distribution plate, and which receives and channels the first reactant gas;

a plurality of second reactant gas passageways defined by the second gas distribution plate, and which extend therethrough, and which are further substantially evenly distributed outside and around the first gas partition means, and which receives and channels a second reactant gas;

a plurality of right angularly shaped second gas partition means for receiving and channeling the second reactant gas and which is made integral with and extends normally upwardly relative to the top surface of the third gas distribution plate, and wherein the respective second gas partition means are defined by a substantially continuous sidewall, the sidewall having a top peripheral edge, the top peripheral edge of the second gas partition means resting in juxtaposed relation against the bottom surface of the second gas distribution plate and located in predetermined spaced relation one relative to the others, and further are located within the second cavity;

a plurality of third reactant gas passageways which are defined, at least in part, within each of the plurality of second gas partition means and which extend through the third gas distribution plate, and which receives and channels the second reactant gas;

a plurality of fourth reactant gas passageways which are defined by the third gas distribution plate and which extend therethrough, and which are further substantially evenly distributed outside and around the plurality of second gas partition means, and which receives and channels the first reactant gas, wherein a first reactant gas pathway is defined by the first and fourth reactant gas passageways, wherein a second reactant gas pathway is defined by the second and third reactant gas passageways, and wherein a first and a second reactant gas moves along the first and second reactant gas pathways and remain separated, one from the other, until they exit the third gas distribution plate.

19. A semiconductor work piece processing reactor, comprising:

a processing chamber defining a deposition region;

a moveable pedestal which supports and horizontally moves a semiconductor work piece to be processed within the deposition region of the processing chamber while in processing; and a gas distribution assembly mounted within the processing chamber and adjacent to the semiconductor work piece, and wherein the gas distribution assembly comprises:

a first, second and third gas distribution plate which are joined together, and wherein the second gas distribution plate is located between the first and third gas distribution plates, and wherein a first cavity is defined between the first and second gas distribution plates, and a second cavity is defined between the second and third gas distribution plates, and wherein a plurality of reactant gases are coupled in fluid flowing relation relative to the respective gas distribution plates;

a plurality of linearly elongated first gas partition means for receiving and channeling a first reactant gas, and which is made integral with and extends normally upwardly relative to a top surface of the second gas distribution plate, and wherein the respective first gas partition means are further located in predetermined spaced relation one relative to the others, and wherein the plurality of first gas partition means are further disposed in juxtaposed relation relative to the first gas distribution plate and are located within the first cavity;

a plurality of first reactant gas passageways which are defined, at least in part, within the plurality of first gas partition means and which extend through the second gas distribution plate, and which receives and channels the first reactant gas;

a plurality of second reactant gas passageways defined by the second gas distribution plate, and which extend therethrough, and which are further substantially evenly distributed outside and around the first gas partition means, and which receives and channels a second reactant gas;

a plurality of right angularly shaped second gas partition means for receiving and channeling the second reactant gas and which is made integral with and extends normally upwardly relative to the top surface of the third gas distribution plate, and wherein the respective second gas partition means are defined by a substantially continuous sidewall, the sidewall having a top peripheral edge, the top peripheral edge of the second gas partition means resting in juxtaposed relation against the bottom surface of the second gas distribution plate and located in predetermined spaced relation one relative to the others, and further are located within the second cavity;

a plurality of third reactant gas passageways which are defined, at least in part, by within each of the plurality of second gas partition means and which extend through the third gas distribution plate, and which receives and channels the second reactant gas;

a plurality of fourth reactant gas passageways which are defined by the third gas distribution plate and which extend therethrough, and which are further substantially evenly distributed outside and around the plurality of second gas partition means, and which receives and channels the first reactant gas, wherein a first reactant gas pathway is defined by the first and fourth reactant gas passageways, wherein a second reactant gas pathway is defined by the second and third reactant gas passageways and wherein a first and a second reactant gas moves along the first and second reactant gas pathways and remain separated, one from the other, until they exit the third gas distribution plate.

20. The semiconductor work piece processing reactor of claim 19, and wherein a plurality of radially extending gas channeling passageways are formed in the bottom surface of the first gas distribution plate, and are further located between the first plurality of predetermined spaced zones, and wherein the first reactant gas passageway carrying the first reactant gas is coupled in fluid flowing relation relative to the plurality of radially extending gas channeling passageways.

21. The semiconductor work piece processing reactor of claim 20, and wherein a plurality of major radially extending reactant gas distribution passageways are defined between the second plurality of zones as defined in the top surface of the second gas distribution plate, and wherein a plurality of minor reactant gas distribution passageways are defined between the respective gas channeling blocks, and wherein a circumscribing reactant gas distribution passageway is formed in the top surface of the second gas distribution plate, and which further surrounds the second plurality of zones as defined by the plurality of gas channeling blocks, and is further coupled in fluid flowing relation relative to the major radially extending reactant gas distribution passageways, and wherein the respective major radially extending reactant gas distribution passageways are substantially coaxially aligned relative to the individual radially extending gas channeling passageways formed in the bottom surface of the first gas distribution plate, and wherein the first reactant gas exits the reactant gas supply plate and travels along the major and minor gas distribution passageways, and the circumscribing gas distribution passageway, and wherein the fourth plurality of gas passageways are located in predetermined spaced relation therealong the major and minor reactant gas distribution passageways, and circumscribing reactant gas distribution passageway, and wherein the first reactant gas exits the second gas distribution plate by way of the fourth plurality of gas passageways.

* * * * *